United States Patent [19]

Nozuyama

[11] Patent Number: 5,677,916
[45] Date of Patent: Oct. 14, 1997

[54] SEMICONDUCTOR INTEGRATED CIRCUIT AND ITS APPLICATION DEVICE

[75] Inventor: Yasuyuki Nozuyama, Tokyo, Japan

[73] Assignee: Kabushiki Kaisha Toshiba, Kawasaki, Japan

[21] Appl. No.: 724,821

[22] Filed: Oct. 2, 1996

[30] Foreign Application Priority Data

Oct. 3, 1995 [JP] Japan .................. 7-256305

[51] Int. Cl.[6] ........................... G01R 31/28; G06F 11/00
[52] U.S. Cl. ........................ 371/22.5; 371/22.6
[58] Field of Search ........................ 371/22.5, 22.6, 371/24, 25.1, 27, 22.4, 22.3, 22.2, 22.1, 21.1, 21.2, 70.1, 20.4, 20.5, 20.6, 71; 395/183.06, 183.19; 324/73.1; 365/201

[56] References Cited

U.S. PATENT DOCUMENTS

| | | | |
|---|---|---|---|
| 4,615,030 | 9/1986 | Kumagai | 371/71 |
| 4,872,168 | 10/1989 | Aadsen et al. | 371/21.3 |
| 4,887,267 | 12/1989 | Kanuma | 371/22.3 |
| 4,980,887 | 12/1990 | Dively et al. | 371/20.2 |

OTHER PUBLICATIONS

IEEE Standard Test Access Port and Boundary-Scan Architecture, chapters 1, 2, 7, and 10, (Std. 1149.1 1990).

Primary Examiner—Hoa T. Nguyen
Attorney, Agent, or Firm—Finnegan, Henderson, Farabow, Garrett & Dunner, L.L.P.

[57] ABSTRACT

A built-in self test circuit incorporated in a mega-cell of an LSI is used to easily check a signal delay between mega-cells. A semiconductor integrated circuit includes the first mega-cell incorporating a built-in self test circuit and an output buffer, the second mega-cell for receiving output data from the output buffer of the first mega-cell, and a flip-flop circuit for storing a logical value at a node on the output side of the output buffer at the same timing as a timing at which the output data from the output buffer are stored in the second mega-cell.

10 Claims, 4 Drawing Sheets

SEMICONDUCTOR INTEGRATED CIRCUIT AND ITS APPLICATION DEVICE

BACKGROUND OF THE INVENTION

1. Field of the Invention

The present invention relates to a design technique for testability for a semiconductor integrated circuit or its application device and, more particularly, to a built-in self test technique, which is used in an LSI such as a logic VLSI hierarchically constituted by incorporating a large number of logic circuit blocks, a system board constituted by connecting a plurality of LSI chips to each other, and the like.

2. Description of the Related Art

With the rapid advance of semiconductor techniques, VLSIs (Very Large Scale Integrated Circuits) which have a larger scale, more complicated structure, and higher performance than those of large scale integrated circuits (LSIs) have been developed. Further, ULSIs (Ultra Large Scale Integrated circuits) are about to be put in practical use. Under these circumstances, how to test these circuits has become a serious problem.

In conventional LSI chips, a method of testing a chip by an LSI tester using only a function defined for a normal operation is generally used. However, according to this method, an enormous amount of test vectors must be formed for VLSIs and ULSIs. Further, since a high-speed operation is often the main feature of these chips, LSI testers compatible with the tests of these chips are limited to higher-performance (normally, expensive) testers. Moreover, in this method, an evaluation of a coverage of the chip test using vectors must be separately performed, resulting in an increase in CPU cost.

For this reason, it is actually almost impossible to completely test the VLSI chips and the ULSI chips by the conventional method. Such a situation also applies to a system board in which a plurality of LSIs including a VLSI and the like are mounted on a circuit board and connected to each other.

As a solution for this serious problem, a design for testability receives a great deal of attention and is widely used. In this design, a test circuit is incorporated in a chip so as to facilitate a test, and the chip is completely tested at a low cost.

According to the technique of a built-in self test (BIST) as a kind of design for testability, an LSI chip as a device under test (DUT) incorporates a test data generation circuit and a test result storing or judging circuit (test result processing circuit, hereafter) for the internal circuit block of the LSI chip. A test is started upon reception of an external signal, and a result judgment signal as for existence or absence of defects in the DUT or a test result for judgment is output upon completion of the test.

By using the BIST, almost no LSI tester is required, and the test cost can be effectively reduced. In addition, a chip can be tested under the same conditions as those of actual use, and the chip can be used after being incorporated in an application system. Owing to these outstanding advantages, the BIST is expected to play a very important role in testing VLSIs and ULSIs.

The most basic technique of the BIST is a technique called a signature analysis. This technique is based on a linear feedback shift register (LFSR). An n-bit LFSR can be used as both a test data generation circuit and a test result determination circuit. The LFSR will be explained below.

FIG. 1A shows an example of an n-bit (n=8) wide LFSR used as a test data generation circuit. The LFSR shown in FIG. 1A is a simple register circuit constituted by n D-type flip-flop (F/F) circuits 41 serially connected to each other, and a feedback circuit (exclusive-OR gate) 42 for generating an exclusive OR signal from a data output Q of the predetermined F/F circuit 41 and inputting it to an input terminal D of the first serially connected F/F.

When the n F/F circuits 41 are set to an initial value (an initialization circuit is not illustrated) except for all "0"'s and then operated, $(2^n-1)$ random data (pseudo-random number) are repeatedly output in a predetermined order. The pseudo-random number can be sequentially extracted by using any one of the data outputs Q (Outi; i=0, ..., 7) of the n F/F circuits 41, or extracted in parallel by using all these outputs. In recent VLSIs and ULSIs which process multi-bit data, the latter scheme is general and important.

The signature analysis is a technique using the LFSR as a test result processing circuit. Also in this case, the LFSR includes an LFSR of a type for serially receiving outputs from a DUT, and an LFSR of a parallel input type called an MISR (Multiple Input Signature Register). The latter is more important in the VLSIs and the ULSIs, so that only the latter will be explained hereinafter.

FIG. 1B shows an example of an LFSR of an n-bit parallel input type used as a test result processing circuit. In the LFSR shown in FIG. 1B, an output Q (=Outi) from an F/F circuit 41 corresponding to an ith bit (i=0, ..., 6) of n D-type F/F circuits 41, and (i+1)th-bit external data IN(i+1) are input to an input D of an (i+1)th-bit F/F circuit 41 via a corresponding exclusive-OR gate 43, respectively. The input D of the 0th-bit F/F circuit 41 receives an output=Q0(+)Q5 (+)Q6(+)Q7((+) is a symbol representing an exclusive-OR operation) from the feedback circuit 42 of the above-described LFSR, and 0th-bit external data IN0 via the corresponding exclusive-OR gate 43.

In this configuration, when response outputs from the DUT are sequentially supplied to the LFSR storing a certain definite value, almost random data are formed in the internal F/F circuits 41 in accordance with these output values, and certain unique test result data are finally formed in the LFSR. The data generated in the LFSR are called a signature, and the operation of supplying response outputs from the DUT and generating a signature is called a signature compression operation or a signature analysis operation.

As described above, the signature analysis is an analysis method of compressing response outputs from the DUT with respect to a series of test data into a signature, and comparing the final test result (signature) left in the LFSR with an expected value to judge the existence or absence of defects in the DUT (an internal circuit block itself). In this signature analysis, the probability of the accurate signature obtained by executing signature compression with sufficient test data is generally $1-2^{-n}$ obtained by subtracting the "aliasing" probability from 1. The "aliasing" probability is a probability at which a final signature accidentally becomes the same as that of a fault-free DUT though an output is different from that of the fault-free DUT. Generally, if n is large (n>24), the aliasing probability can be ignored. Therefore, the reliability of the signature analysis is very high in the VLSIs and ULSIs which generally process multi-bit wide data (n≧32).

The LFSR dedicated to the BIST may be provided. In many cases, however, a normal operation register is used as the LFSR to save the cost of a test circuit.

Conventionally, as one arrangement of a logical VLSI and the like, a large number of logic circuit blocks (called mega-cells or micro-blocks) are connected to each other via lines. The mega-cell (macro-block) is one block of logic circuits having a certain degree of scale inside a VLSI or the like. According to a current design technique, these mega-cells are schematically arranged manually or automatically, and signal lines are automatically arranged between the mega-cells to constitute the VLSI or the like. Recently, CAD tools which lay out these mega-cells as a whole almost needless to distinguish them in terms of the layout are commercially available.

Particularly in a certain arrangement, one of many mega-cells is a large-scale complicated mega-cell such as a CPU core, the remaining mega-cells are connected to a system bus, and the CPU core controls the entire operation. A system on a board is also constituted by complicatedly connecting many LSIs to each other via lines. Note that an output buffer having a large driving force is arranged at the output terminal portion of the I/O (Input/Output) portion of each mega-cell or each LSI chip so as to rapidly drive a generally long line.

As described above, a reduction in test cost is a very important theme in the VLSI and the like constituted by a large number of mega-cells, and the system board constituted by a large number of LSI chips. If a BIST circuit is incorporated in, e.g., a CPU chip in an LSI, or a CPU core as the main part of a mega-cell, part or most of the inside of the CPU chip or the CPU core is automatically tested by the BIST circuit. The test cost can be reduced.

In general, the BIST can be executed as far as a circuit such as an LFSR for compressing a test result into a signature is provided. For this reason, in the conventional configuration, a portion outside the I/O portion of the CPU chip or the CPU core incorporating the BIST circuit cannot be tested inside the CPU chip or the CPU core.

The testability at an individual mega-cell or LSI chip level is an important problem to be solved in testing the VLSI, the system board, and the like. However, the testability of an enormous number of signal lines arranged between mega-cells or LSI chips is also a very important problem to be solved. Actually, a delay by the lines between the mega-cells or the LSI chips is the main factor of a signal delay on the chip or board scale in the VLSI and the like constituted by a large number of mega-cells, or the system board constituted by a large number of LSI chips. Particularly, the I/O terminals of the large number of mega-cells or LSI chips are connected to signal lines such as common buses. In many cases, therefore, the delay by the lines between the mega-cells or the LSI chips substantially determines the AC operation performance of the VLSI or the like, or the system board.

As a design technique for testability including a test for a delay caused by signal lines between mega-cells or LSI chips, there is a boundary scan scheme in which an F/F circuit is arranged at the I/O terminal portion of an LSI chip or a mega-cell to improve the controllability and the observation properties. Some boundary scan schemes have already been authorized as IEEE standards.

FIG. 2 shows a boundary scan cell for an output terminal corresponding to one bit related to a basic circuit configuration in the boundary scan scheme.

In FIG. 2, reference numerals 51 and 52 denote AND gates for receiving corresponding control signals S0 and S1; 53, an exclusive-OR gate; 54, an F/F circuit used for boundary scan; 55, an F/F circuit; 56, a selector circuit for selecting an input in accordance with a control signal S2; and 57, an output buffer.

The operation of the circuit in FIG. 2 is determined by the control signals S0, S1, and S2. A normal operation is specified by S2=0 (S0 and S1 are indefinite). An internal signal DI input to a chip or a mega-cell is externally output as an output signal DO via the selector circuit 56 and the output buffer 57.

At this time, if S0=1 and S1=0, the input signal DI is received by the F/F circuit 54 via the AND gate 51 and the exclusive-OR gate 53 in synchronism with a clock signal CLK.

To the contrary, if S0=0 and S1=1, a boundary scan-in signal BSI input from a boundary scan cell (not shown) on the input stage is received by the F/F circuit 54 via the AND gate 52 and the exclusive-OR gate 53 in synchronism with the clock signal CLK. The contents of the F/F circuit 54 are output as a boundary scan-out signal BSO to a boundary scan cell (not shown) on the output stage. In this manner, the boundary scan operation is realized.

With this operation, all boundary scan cells including the boundary scan cell at the I/O portions of LSI chips or mega-cells are serially connected as a boundary scan chain. The contents of the boundary scan cells can be externally output in synchronism with the clock signal CLK, and test data can be externally transferred to the boundary scan cells. The boundary scan cell shown in FIG. 2 has a configuration capable of a signature analysis. When S0=S1=1, the boundary scan cell performs the signature compression operation in synchronism with the clock signal CLK.

The F/F circuit 55 prevents generation of data which may induce an abnormal operation with respect to the outside during the boundary scan operation or the BIST operation. That is, the clock signal CLK is activated to transfer desired data to the boundary scan cell. Thereafter, another clock signal CLKUD is activated to update the data. This output is captured by the boundary scan cell of another chip or another mega-cell to test signal lines between chips or mega-cells (a signal delay can also be evaluated).

In the boundary scan scheme as described above, a signal delay between LSI chips or mega-cells must be tested by arranging the boundary scan cells at the respective I/O portions. In the VLSI or the like constituted by a large number of mega-cells, if the boundary scan cells are separately incorporated in the I/O portions of the respective mega-cells, the chip area is greatly increased to greatly increase the cost.

As described above, in summary, in the VLSI or the ULSI having many mega-cells connected to each other via long signal lines, or in the system board having a plurality of LSI chips connected to each other via long signal lines, a signal delay between the mega-cells or the LSI chips is given much weight in the entire AC operation performance and determines the entire AC operation performance in some cases. In this case, if a mega-cell or an LSI chip incorporating a BIST circuit to test its internal circuit is included, the mega-cell or the LSI chip including the BIST circuit normally supplies a definite output to another mega-cell or another LSI chip. For all that, there is no configuration capable of checking a signal delay between another mega-cell or another LSI chip and the mega-cell or the LSI chip incorporating the BIST circuit by using the definite output.

In the boundary scan scheme capable of checking a signal delay between mega-cells or LSI chips, an overhead is too large in area with respect to particularly a VLSI chip or the like. Therefore, it poses a problem in terms of the cost to employ the boundary scan scheme.

SUMMARY OF THE INVENTION

As described above, in the VLSI or the ULSI having a plurality of mega-cells connected to each other via long signal lines, or the system board having a plurality of LSI chips connected to each other via long signal lines, it poses a problem in terms of the cost to employ the boundary scan scheme in order to check a signal delay between the mega-cells or the LSI chips.

The present invention has been made to solve the above problem, and has as its another object to provide a semiconductor integrated circuit capable of easily checking a signal delay between mega-cells by using a BIST circuit and provide a semiconductor integrated circuit application device capable of easily checking a signal delay between LSI chips by using the BIST circuit.

According to the present invention, a semiconductor integrated circuit is characterized by comprising a first logic circuit block having a built-in self test circuit and an output buffer, a second logic circuit block for receiving output data from the output buffer of the first logic circuit block, and data storage means arranged in the first logic circuit block to store a logical value at a node on an output side of the output buffer at the same timing as a timing at which the output data from the output buffer are stored in the second logic circuit block.

According to the present invention, a semiconductor integrated circuit application device is characterized by comprising a first semiconductor integrated circuit having a built-in self test circuit and an output buffer, a second semiconductor integrated circuit connected to the first semiconductor integrated circuit to receive output data from the output buffer, and data storage means arranged in the first semiconductor integrated circuit to store a logical value at a node on an output side of the output buffer at the same timing as a timing at which the output data from the output buffer are stored in the second semiconductor integrated circuit.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

DETAILED DESCRIPTION OF THE PREFERRED EMBODIMENTS

Embodiments of the present invention will be described below with reference to the accompanying drawings.

Figure 1A:
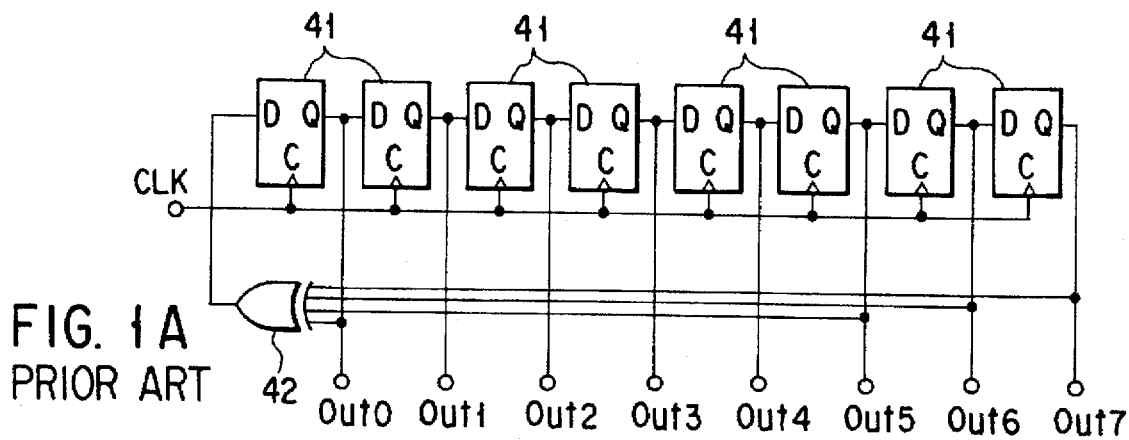
FIGS. 1A and 1B are circuit diagrams showing an example of an n-bit linear feedback shift register used as a test data generation circuit and an example of a linear feedback shift register of an n-bit parallel input type used as a test result determination circuit, respectively.
Figure 1B:
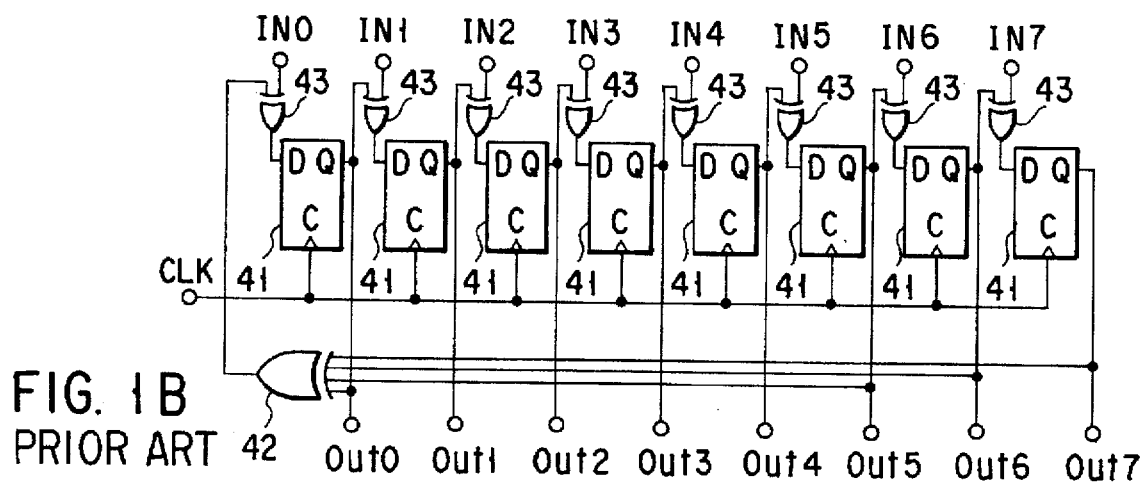
Figure 2:
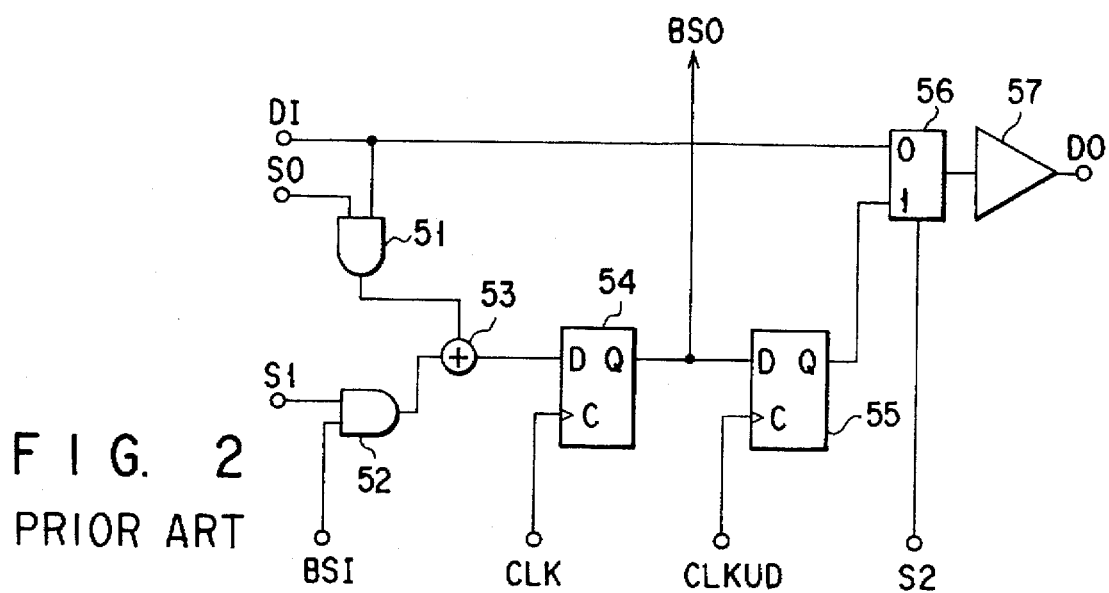
FIG. 2 is a circuit diagram showing a boundary scan cell corresponding to one bit related to a basic circuit configuration in a boundary scan scheme.
Figure 3:
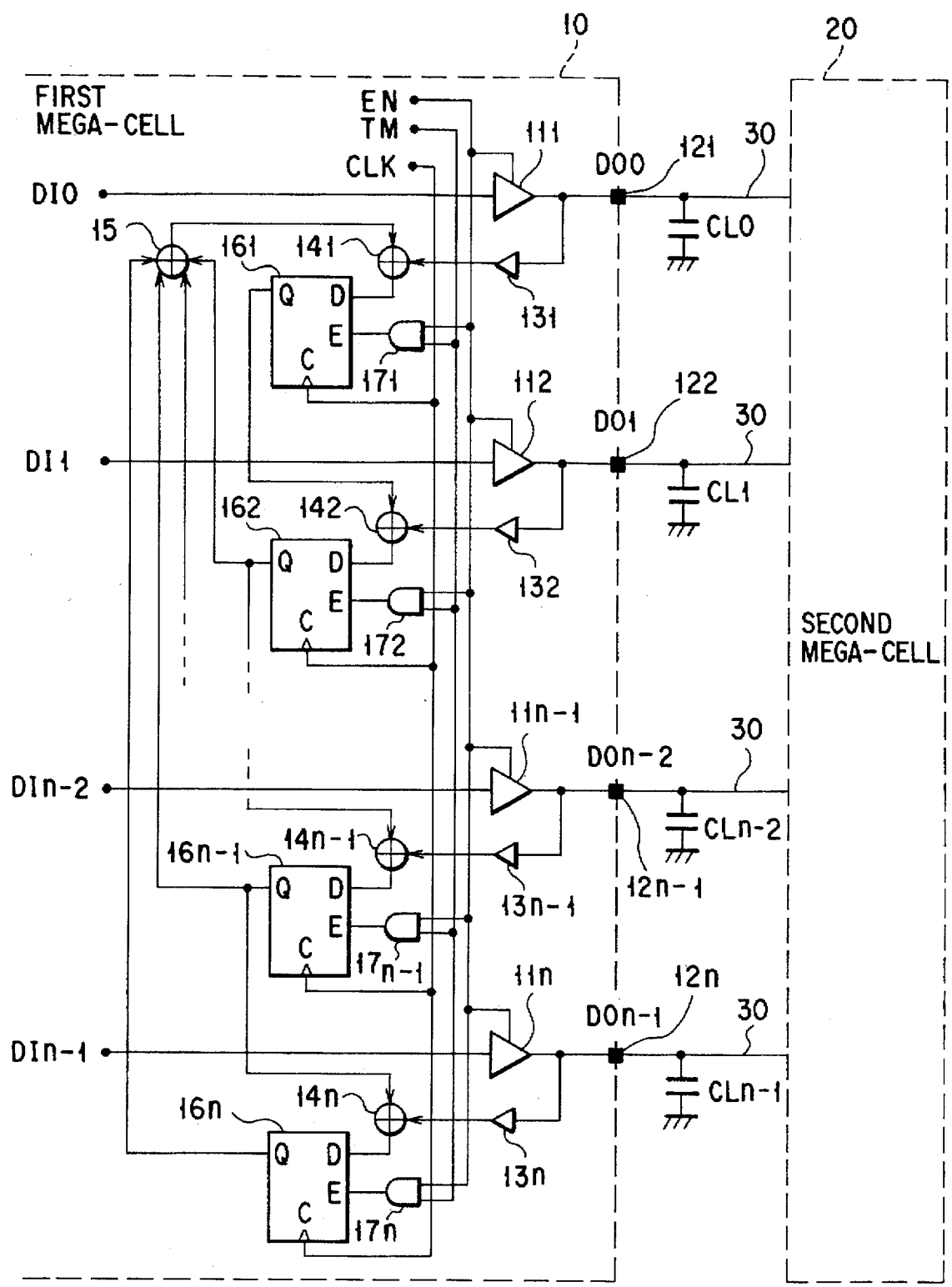
FIG. 3 is a circuit diagram showing part of an LSI according to the first embodiment of the present invention.

FIG. 3 shows part of an LSI according to the first embodiment of the present invention.

First of all, the first embodiment will be generally explained. The LSI in FIG. 3 is constituted by connecting a plurality of mega-cells including first and second mega-cells 10 and 20 to each other via signal lines.

The first mega-cell 10 is an n-bit output mega-cell, which has output buffers 111 to 11n, output terminals 121 to 12n, and the like corresponding to n bits, and incorporates a BIST circuit.

The first mega-cell 10 further comprises an LFSR as a data storage means for storing logical values at nodes on the output side of the output buffers at the same timing as a timing at which output data from the output buffers are stored in the second mega-cell 20.

The second mega-cell 20 receives and stores the output data from the output buffers of the first mega-cell 10.

Reference symbols CLi (i=0, . . . , n−1) denote the parasitic load capacitances of signal lines 30 connecting the first mega-cell 10 to the second mega-cell 20.

In the LSI of FIG. 3, a signal delay between the mega-cells also includes a signal delay on the signal lines 30 connecting the mega-cells. If the signal lines 30 are longer, the signal delay between the mega-cells becomes larger and becomes a factor of determining the entire AC operation performance. Particularly when the signal lines 30 are system buses, the signal delay is very large because the I/O terminals of a plurality of mega-cells are connected to the system buses.

The linear approximation of the signal delay between the mega-cells is obtained by the driving forces of the output buffers which output signals from the mega-cell, and the load capacitances (indicated by CLi in FIG. 3) of the signal lines 30 on the output side of the output buffers and elements connected to the signal lines 30. Note that a line on an actual VLSI chip or the like has a certain degree of line resistance. However, as far as a metal line is used, a potential near the output side of the output buffer reflects a potential at the input portion of another mega-cell which receives a signal with a precision sufficient for practical use. In addition, it is not so difficult to output definite data as (some of) outputs in executing the BIST in a mega-cell incorporating the BIST circuit which supplies outputs to system buses, like a CPU core.

In consideration of these situations, according to the present invention, outputs from a mega-cell which incorporates the BIST circuit and outputs definite data are sampled on the output side of the output buffers of this mega-cell and compressed into a signature, thereby easily checking a signal delay between mega-cells.

The first embodiment will be described below in detail.

In the first mega-cell 10 of FIG. 3, reference numerals 111 to 11n denote output buffers; 121 to 12n, output terminals; 131 to 13n, input buffers; 141 to 14n and 15, exclusive-OR gates; 161 to 16n, F/F circuits; and 171 to 17n, AND gates.

Each of the output buffers 111 to 11n corresponding to n bits is a 3 state output buffer controlled to be activated by, e.g., an activation signal EN. When the activation signal EN="1" level, a data input value DIi (i=0, 2, ..., n-1) is output as an output value DOi. When the activation signal EN=0, the output is set at a high impedance.

In this embodiment, it is assumed that EN=1 means that the data input signal DIi to a corresponding one of the output buffers 11₁ to 11n is effective in the first mega-cell 10.

Note that simple 2-value buffers are used as the output buffers 11₁ to 11n in many cases. In this case, the data input signal DIi is always externally output as DOi.

The F/F circuits 16₁ to 16n, the exclusive-OR gates 14₁ to 14n arranged in correspondence with the F/F circuits 16₁ to 16n, and the exclusive-OR gate 15 for generating linear feedback data constitute an n-bit signature compression LFSR, as described above. In this embodiment, the exclusive-OR gate 15 feeds back data outputs Q corresponding to 1st, (n—2)th, and (n−1)th bits and remaining bits from the F/F circuits 16₁ to 16n.

The input buffers 13₁ to 13n for n bits are arranged to supply outputs from the corresponding output buffers 11₁ to 11n for n bits to the n-bit LFSR. The input buffers 13₁ to 13n are buffers having a driving force equal to that set at the input portion of a general mega-cell.

Each of the exclusive-OR gates 14₁ to 14n receives a corresponding one of outputs from the input buffers 13₁ to 13n for n bits and a corresponding one of an output from the exclusive-OR gate 15 and the data outputs Q from the F/F circuits 16₁ to 16n−1 of the n-bit LFSR. The exclusive-OR gates 14₁ to 14n supply exclusive-OR outputs as data inputs D to the F/F circuits 16₁ to 16n of the n-bit LFSR.

The AND gates 17₁ to 17n receive the activation signal EN and a BIST mode signal TM, and supply AND outputs as control inputs E to the corresponding F/F circuits 16₁ to 16n of the n-bit LFSR. A clock signal CLK for latching data is supplied to the F/F circuits 16₁ to 16n.

In this embodiment, when the BIST mode signal TM=1, signature compression is executed. If the first mega-cell 10 is subjected to the BIST, the signals DIi internally propagate from the first mega-cell 10 to the input portions of the corresponding output buffers 11₁ to 11n.

In this embodiments, an AND output of the activation signal EN and the BIST mode signal TM is used as an activation signal to allow the F/F circuits 16₁ to 16n to latch data. If DIi must be forcibly output, e.g., the above AND output must be used as an activation signal to the output buffers 11₁ to 11n.

To the contrary, when an always definite value is output as DOi during the BIST of the mega-cell 10, only the BIST mode signal TM representing execution of the BIST is supplied as an activation signal to the F/F circuits 16₁ to 16n. In any case, a data input activation signal to the LFSR is constituted by using a signal having information representing that DIi is effective. In this manner, the LFSR operates during only the BIST, which leads to a reduction in power consumption. To accurately execute the signature analysis in the n-bit LFSR, the LFSR is first initialized by a signal at the start of the BIST with respect to the first mega-cell 10, and then starts to receive data only when DIi (i=0, 1, ..., n−1) is definite data. An initialization/signature analysis start circuit is not essential to the present invention, and a detailed description thereof will be omitted.

In the present invention, the timing of the clock signal CLK for latching data in the F/F circuits 16₁ to 16n must be synchronized with a timing at which the second mega-cell 20 receives outputs from the first mega-cell 10. In this embodiment, the internal clock signal CLK of the first mega-cell 10 is input to clock input terminals C of the F/F circuits 16₁ to 16n. Results may be extracted from the LFSR serially by using the scan scheme or parallel by arranging a parallel read path.

According to the first embodiment described above, data which will be finally output outside the first mega-cell 10 from the output buffers 11₁ to 11n of the first mega-cell 10 incorporating the BIST circuit are captured on the output side of the output buffers 11₁ to 11n and compressed into a signature. For this reason, data can be compressed into a signature having signal delays between the mega-cells. Since observation points for signature compression are arranged at the output portions of the output buffers of the mega-cell in this manner, a signal delay by the load capacitances CLi of the signal lines 30 between the mega-cells and the elements connected to the signal lines 30 can be easily evaluated.

In the first embodiment described above, the circuits for capturing outputs and compressing them into a signature are arranged in correspondence with the output terminals 12₁ to 12n of the first mega-cell 10. However, the present invention is not limited to this, and gates for capturing outputs and compressing them into a signature can be arranged in correspondence with the I/O terminals of the mega-cell. In this case, to prevent a stricter timing for an input signal, it is desirable to arrange the input buffers 13₁ to 13n in the first mega-cell 10 of FIG. 3 parallel to input buffers (not shown) for normal operation logic. If an LFSR is used for a boundary scan circuit or the BIST circuit in the mega-cell, this LFSR is constituted by the F/F circuits 16₁ to 16n shown in FIG. 3. With this arrangement, almost no additional circuit is actually required. If the number of bits of output terminals provided with the circuits for capturing outputs and compressing them into a signature is insufficient, F/F circuits must be added to constitute the LFSR so as to reduce the alias probability to a negligible degree as a whole, as a matter of course.

Figure 4:
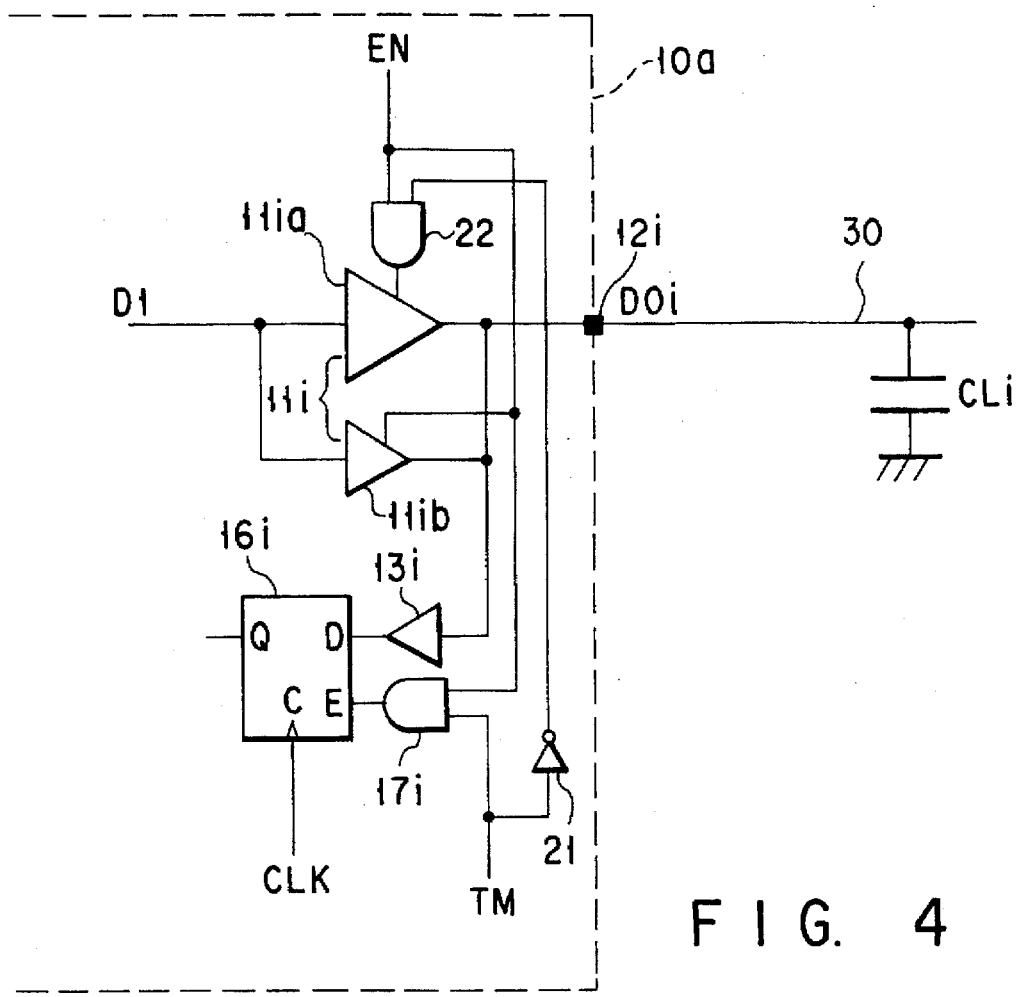
FIG. 4 is a circuit diagram showing part of an LSI according to the second embodiment of the present invention.

In the first embodiment, outputs from the output buffers of the mega-cell are directly compressed into a signature. In this case, in a very-high-speed VLSI chip, a high-speed (i.e., expensive) LSI tester must be used in correspondence with this VLSI chip. FIG. 4 shows the second embodiment in consideration of this point.

FIG. 4 shows part of the second embodiment according to the present invention.

In the second embodiment, the present invention is applied to an LSI having a plurality of mega-cells 10a connected to each other via long signal lines 30, like in the first embodiment described above. FIG. 4 shows only a portion related to an ith bit in an n-bit output mega-cell for the sake of descriptive simplicity. The same reference numerals as in FIG. 3 denote the same parts.

In the second embodiment, an output buffer 11i is divided into two buffers 11ia and 11ib. A signal EN, and a signal obtained by inverting a signal TM via an inverter circuit 21 are input to an AND gate 22 to calculate an AND output. One buffer 11ia is controlled by this AND output, and the other buffer 11ib is controlled by the signal EN.

With this arrangement, in executing the BIST (TM=1), one (the buffer 11ib in this embodiment) of the output buffers 11ia and 11ib is operated. Since the driving force of the output buffer 11i is reduced by the driving force of one output buffer 11ib, a signal delay increases to allow even a low-speed LSI tester to evaluate the AC operation performance of the chip on the basis of the signal delay between mega-cells with a sufficient margin. The output buffer 11*i* easily incorporates the buffers 11*ia* and 11*ib* because the output buffer of the mega-cell generally uses a plurality of parallel driver elements.

According to the present invention described above, since the load capacitance is increased to increase the signal delay, both an error caused by an excessive signal delay between mega-cells and most of short-circuit failures of lines between the mega-cells can be detected.

On the other hand, when a line between mega-cells is disconnected or has a very high resistance, the capacitance load seems to be lighter at the portion. Such a failure cannot be detected by the present invention.

In general, however, a low-speed test (therefore, a low-cost LSI tester) is sufficient to detect the above-described failures in the VLSI and is easily realized. Therefore, it is not an essential problem that the present invention cannot detect such a failure.

It is easy to combine the circuit according to the present invention with another test circuit. For example, the LFSR using the n F/F circuits is used as a signature compression circuit for the BIST circuit in the mega-cell, or the circuit of the present invention is constituted on the basis of F/F circuits for the boundary scan circuit. All these examples are incorporated in the scope of the present invention. In addition, changes in the number of buffers and the configuration of the logic gate in order to improve the timing is also incorporated in the scope of the present invention.

The respective embodiments exemplify the LSIs each capable of easily checking a signal delay between mega-cells by using the BIST circuit. The present invention can be applied to an LSI application device constituted by connecting a plurality of LSI chips to each other via signal lines to easily check a signal delay between the LSI chips by using the BIST circuit.

Figure 5:
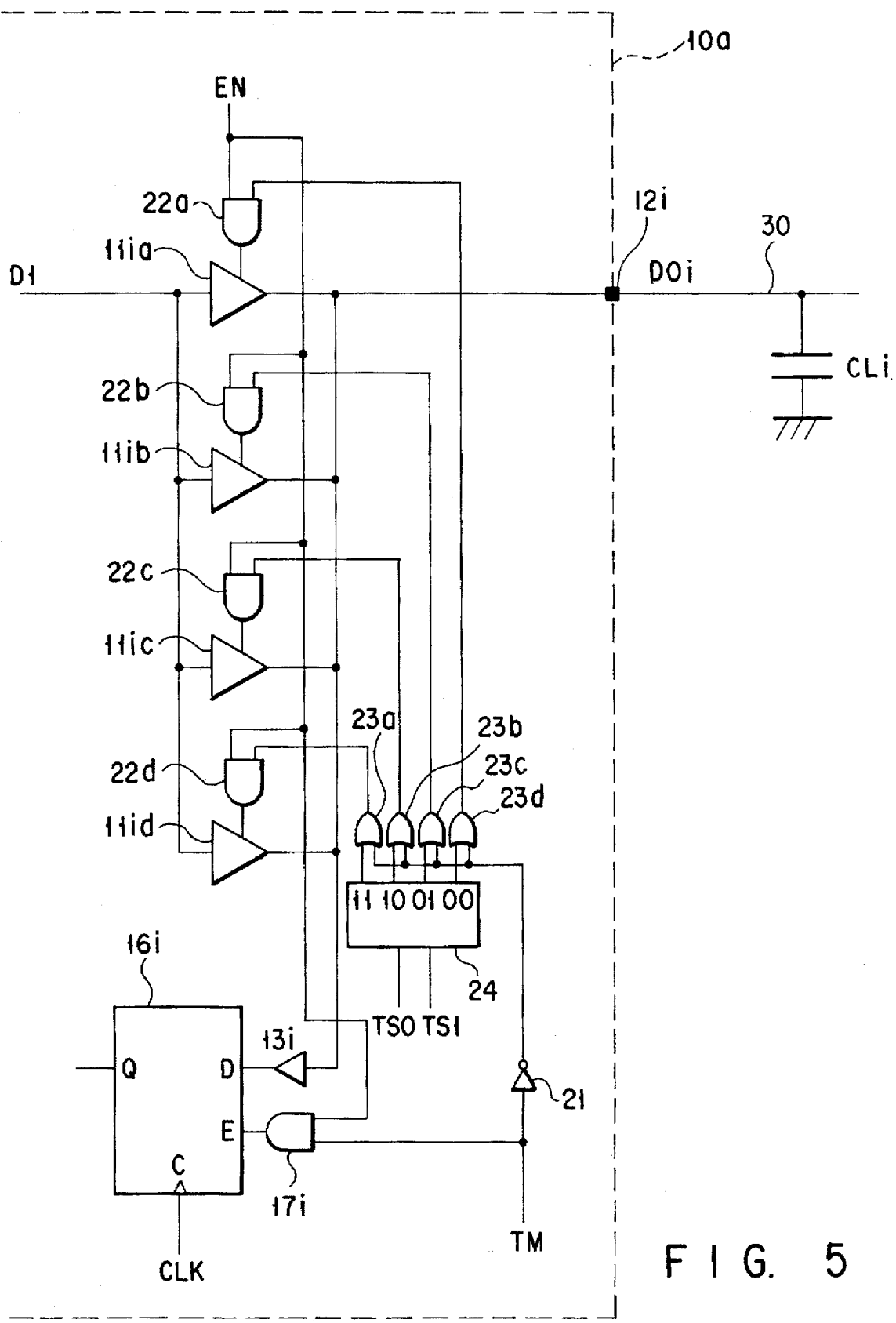
FIG. 5 is a circuit diagram showing part of an LSI according to the third embodiment of the present invention.

FIG. 5 shows part of the third embodiment according to the present invention.

In the third embodiment, the present invention is applied to an LSI constituted by connecting a plurality of mega-cells 10*a* to each other via long signal lines 30, like in the first embodiment. FIG. 5 shows only a portion related to an ith bit in an n-bit output mega-cell for the sake of descriptive simplicity. The same reference numerals as in FIG. 3 denote the same parts.

In the second embodiment, the output buffer is divided, and an output from a resultant small output buffer having a weak driving force is input to the signature analyzer to evaluate the AC performance. However, the second embodiment has a problem in which the AC operation performance of the output buffer portion having a main driving force cannot be evaluated.

The third embodiment solves this problem. More specifically, an output buffer used for a normal operation is divided into several small buffers, and the AC operation performance of each divided small buffer can be evaluated.

In the third embodiment, the output buffer is divided into four buffers 11*ia*, 11*ib*, 11*ic*, and 11*id*. An output from a decoder 24, and a signal obtained by inverting a signal TM via an inverter circuit 21 are input to OR gates 23*a*, 23*b*, 23*c*, and 23*d* to calculate an OR output. The buffers 11*ia*, 11*ib*, 11*ic*, and 11*id* are controlled by the OR output. With this arrangement, in executing the BIST (TM=1), one of four outputs from the 2-bit decoder 24 changes to 1 in accordance with values TS1 and TS0. An output from one of the OR gates 23*a*, 23*b*, 23*c*, and 23*d* which is connected to the changed output changes to 1. When EN=1, an output from one of AND gates 22*a*, 22*b*, 22*c*, and 22*d* which receives this output changes to 1. Only one of the four small buffers 11*ia*, 11*ib*, 11*ic*, and 11*id* which is controlled by this output can supply an output. In executing a test, TS0 and TS1 are automatically counted to allow evaluation of the performance of all the small buffers. In the normal operation (TM=0), outputs from all the OR gates 23*a*, 23*b*, 23*c*, and 23*d* change to 1. When EN=1, all the small buffer can supply outputs.

In the present invention, similar to the second embodiment, since the load capacitance is increased to increase the signal delay, both an error caused by an excessive signal delay between mega-cells and most of short-circuit failures of lines between the mega-cells can be detected.

In this embodiment, the number of small buffers is four. However, if it is more important to decrease the number of test signals, the number of small buffers can be decreased to three. In this case, TS1=0 and TS0=0 are defined as a normal operation mode, the number of signal lines can be decreased by 1, compared to the case of FIG. 5.

It is easy to combine the circuit according to the present invention with another test circuit. For example, the LFSR using the n F/F circuits is used as a signature compression circuit for the BIST circuit in the mega-cell, or the circuit of the present invention is constituted on the basis of F/F circuits for the boundary scan circuit. All these examples are incorporated in the scope of the present invention. In addition, changes in the number of buffers and the configuration of the logic gate in order to improve the timing is also incorporated in the scope of the present invention.

The respective embodiments exemplify the LSIs each capable of easily checking a signal delay between mega-cells by using the BIST circuit. The present invention can be applied to an LSI application device constituted by connecting a plurality of LSI chips to each other via signal lines to easily check a signal delay between the LSI chips by using the BIST circuit.

Figure 6:
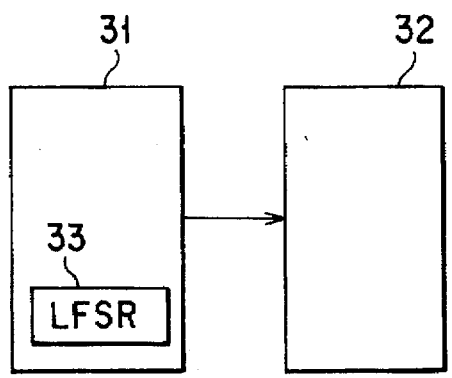
FIG. 6 is a block diagram showing an LSI application device according to the second and third embodiments of the present invention.

FIG. 6 shows a system board according to an example of an LSI application device.

This system board has a BIST circuit and an output buffer. The system board comprises a first LSI 31 mounted on a circuit board, a second LSI 32 mounted on the circuit board and connected to the first LSI to receive output data from the output buffer of the first LSI 31, and a data storage means (e.g., an LFSR 33 like the one described above) arranged in the first LSI 31 to store a logical value at a node on the output side of the output buffer at the same timing as a timing at which the output data from the output buffer are stored in the second LSI 32.

As has been described above, according to the present invention, the LSI and the LSI application device can execute a test with a signal delay caused by the capacitance load of a line and an element between mega-cells or chips. For this reason, not only a mega-cell or a chip incorporating a BIST circuit can be tested, but also the AC operation performance including a signal delay between mega-cells or chips, which is important in a VLSI and a ULSI, can be easily checked at a chip level.

In the VLSI and the ULSI required to evaluate the maximum operation frequency, therefore, most of chip wafers insufficient in AC operation performance can be rejected in a die sort test, and the rejected chips need not be sealed in a package. The test cost can be reduced as a whole.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A semiconductor integrated circuit comprising:

a first logic circuit block having a built-in self test circuit and an output buffer;

a second logic circuit block for receiving output data from said output buffer of said first logic circuit block; and data storage means arranged in said first logic circuit block to store a logical value at a node on an output side of said output buffer at the same timing as a timing at which the output data from said output buffer are stored in said second logic circuit block.

2. A circuit according to claim 1, wherein said data storage means is part or all of a linear feedback shift register.

3. A circuit according to claim 2, wherein said output buffer is a 3-value buffer which is controlled to be activated by an activation signal, and said linear feedback shift register is set in a state capable of storing data when the activation signal and/or a built-in self test mode signal is input.

4. A circuit according to claim 1, wherein said output buffer is constituted by combining parallel at least a first output buffer and a second output buffer, said first logic circuit block further comprises activation means for activating only said first output buffer of said first output buffer and said second output buffer, and said storage means can store a logical value at the node on the output side of said output buffer when said first output buffer is activated by said activation means.

5. A circuit according to claim 1, wherein said output buffer is constituted by combining parallel at least three small output buffers, said first logic circuit block further comprises activation means for activating only one of said small output buffers, and said storage means can store the logical value at the node on the output side of said output buffer when said small output buffer is activated by said activation means.

6. A semiconductor integrated circuit application device comprising:

a first semiconductor integrated circuit having a built-in self test circuit and an output buffer;

a second semiconductor integrated circuit connected to said first semiconductor integrated circuit to receive output data from said output buffer; and data storage means arranged in said first semiconductor integrated circuit to store a logical value at a node on an output side of said output buffer at the same timing as a timing at which the output data from said output buffer are stored in said second semiconductor integrated circuit.

7. A device according to claim 6, wherein said storage means is part or all of a linear feedback shift register.

8. A device according to claim 7, wherein said output buffer is a 3-value buffer which is controlled to be activated by an activation signal, and said linear feedback shift register is set in a state capable of storing data when the activation signal and/or a built-in self test mode signal is input.

9. A device according to claim 6, wherein said output buffer is constituted by combining parallel at least a first output buffer and a second output buffer, said first semiconductor integrated circuit further comprises activation means for activating only said first output buffer of said first output buffer and said second output buffer, and said storage means can store a logical value at the node on the output side of said output buffer when said first output buffer is activated by said activation means.

10. A device according to claim 6, wherein said output buffer is constituted by combining parallel at least three small output buffers, said first semiconductor integrated circuit further comprises activation means for activating only one of said small output buffers, and said storage means can store the logical value at the node on the output side of said output buffer when said small output buffer is activated by said activation means.

* * * * *